(12) United States Patent
Misra et al.

(10) Patent No.: US 12,739,995 B2
(45) **Date of Patent: *Sep. 15, 2026**

(54) ELECTRONIC DEVICE INCLUDING CLAD COMPONENTS

(71) Applicant: Apple Inc., Cupertino, CA (US)

(72) Inventors: Abhijeet Misra, Mountain View, CA (US); Hoishun Li, Sunnyvale, CA (US); Todd S. Mintz, San Jose, CA (US); Isabel Yang, San Jose, CA (US); James A. Curran, Sunnyvale, CA (US); Lei Gao, Shanghai (CN); Chuan Liu, Honghu (CN); Yu Yan, Shanghai (CN)

(73) Assignee: APPLE INC., Cupertino, CA (US)

( * ) Notice: Subject to any disclaimer, the term of this patent is extended or adjusted under 35 U.S.C. 154(b) by 252 days.

This patent is subject to a terminal disclaimer.

(21) Appl. No.: 18/461,458

(22) Filed: Sep. 5, 2023

(65) Prior Publication Data

US 2024/0373574 A1 Nov. 7, 2024

Related U.S. Application Data

(60) Provisional application No. 63/500,512, filed on May 5, 2023.

(51) Int. Cl.

| | |
|---|---|
| ***H05K 5/04*** | (2006.01) |
| ***B32B 15/01*** | (2006.01) |
| ***G06F 1/16*** | (2006.01) |
| ***H05K 5/00*** | (2006.01) |

(52) U.S. Cl.
CPC ............ *H05K 5/04* (2013.01); *B32B 15/017* (2013.01); *G06F 1/1656* (2013.01); *H05K 5/0086* (2013.01)

(58) Field of Classification Search
CPC ............................... H05K 5/04; B32B 15/017
See application file for complete search history.

(56) References Cited

U.S. PATENT DOCUMENTS

| | | | |
|---|---|---|---|
| 7,697,281 | B2 | 4/2010 | Dabov et al. |
| 10,447,834 | B2 | 10/2019 | Misra et al. |
| 10,927,473 | B2 | 2/2021 | Curran et al. |

(Continued)

FOREIGN PATENT DOCUMENTS

| | | |
|---|---|---|
| CN | 103249267 A | 8/2013 |
| CN | 109475056 A | 3/2019 |

(Continued)

OTHER PUBLICATIONS

Gadakh, et al., "Solid-state Joining of Aluminum to Titanium: A Review", Proceedings of the Institution of Mechanical Engineers, Part L: Journal of Materials; Design and Applications, vol. 235, Issue 8, May 22, 2021.

(Continued)

*Primary Examiner* — Adam Krupicka
(74) *Attorney, Agent, or Firm* — Dorsey & Whitney LLP

(57) ABSTRACT

A housing for an electronic device can include an exterior titanium portion, an interior metal joined to the exterior titanium portion, the interior metal being a different metal than the exterior titanium portion, and an intermetallic compound having a thickness of less than 1 μm disposed between the interior metal and the exterior titanium portion.

19 Claims, 13 Drawing Sheets

(56) References Cited

U.S. PATENT DOCUMENTS

| | | | |
|---|---|---|---|
| 12,150,264 | B1 | 11/2024 | Misra et al. |
| 2008/0316685 | A1 | 12/2008 | Chen et al. |
| 2009/0168337 | A1 | 7/2009 | Conti et al. |
| 2009/0197116 | A1 * | 8/2009 | Cheng .................. B32B 15/013 428/651 |
| 2017/0051426 | A1 | 2/2017 | Curran et al. |
| 2018/0070465 | A1 | 3/2018 | Cater et al. |
| 2018/0084653 | A1 | 3/2018 | Misra et al. |
| 2018/0084658 | A1 | 3/2018 | Curran et al. |
| 2019/0037721 | A1 | 1/2019 | Curran et al. |
| 2020/0076058 | A1 | 3/2020 | Zhang et al. |
| 2020/0101558 | A1 | 4/2020 | Hashimoto et al. |
| 2020/0245487 | A1 | 7/2020 | Counts et al. |
| 2020/0347492 | A1 | 11/2020 | Tryon et al. |
| 2022/0304175 | A1 | 9/2022 | Hamann et al. |
| 2024/0284624 | A1 | 8/2024 | Counts et al. |
| 2025/0048576 | A1 | 2/2025 | Misra et al. |

FOREIGN PATENT DOCUMENTS

| | | | |
|---|---|---|---|
| CN | 111491469 | A | 8/2020 |
| CN | 112203444 | A | 1/2021 |
| CN | 113699573 | A | 1/2021 |
| JP | 2020070466 | A | 11/2022 |
| WO | 2011087487 | A1 | 7/2011 |
| WO | 2020131262 | A1 | 6/2020 |
| WO | 2022183956 | A1 | 9/2022 |

OTHER PUBLICATIONS

Huang, et al., "A New Method of Hybrid Friction Stir Welding Assisted by Friction Surfacing for Joining Dissimilar Ti/AL Alloy", Materials Letters, vol. 207, pp. 172-175, Jul. 19, 2017.

Liu, et al., "Atomic Diffusion Mechanism and Interface Nanomechanics in the AI/TI Composite Structures", Composites Part B: Engineering, vol. 230, Article 109507, Feb. 1, 2022.

* cited by examiner

ELECTRONIC DEVICE INCLUDING CLAD COMPONENTS

CROSS-REFERENCE TO RELATED APPLICATIONS

This claims priority to U.S. Provisional Patent Application No. 63/500,512, filed 5 May 2023, and entitled "Electronic Device Including Clad Components," the entire disclosure of which is hereby incorporated by reference.

FIELD

The described embodiments relate generally to materials for housings, structures, and/or electronic devices. More particularly, the present embodiments relate to clad parts used in for housings, structures, and/or electronic devices, which have improved cosmetic finishes, reduced mass, improved machinability, and reduced environmental impact.

BACKGROUND

Electronic devices are widespread in society and can take a variety of forms, from wristwatches to computers. Electronic devices, including portable electronic devices such as handheld phones, tablet computers, and watches, can experience contact with various surfaces during use. Further, use, transportation, and storage of such devices can exert mechanical and thermal stresses thereon.

Components for these devices, such as enclosures or housings, can benefit from exhibiting different combinations of properties relating to the use of the device. A housing for a portable electronic device can have a combination of properties, such as strength, appearance, toughness, abrasion resistance, weight, corrosion resistance, thermal conductivity, electromagnetic shielding, and cost, in order for the device to function as desired. Certain materials can provide a desired level of performance with respect to some properties but may not provide an optimal level of performance with respect to other others. Further, the combination of multiple materials in complex design configurations can introduce complications into traditional manufacturing processes, often increasing cost and processing time. Thus, it can be desirable to provide a device enclosure including multiple materials to achieve a desired combination of somewhat disparate properties, as well as effective processes for forming them.

SUMMARY

According to some aspects of the present disclosure, a housing for an electronic device includes an exterior titanium portion, an interior metal joined to the exterior titanium portion, and an intermetallic compound disposed between the interior metal and the exterior titanium portion. The interior metal can be a different metal than the exterior titanium portion. The intermetallic compound can have a thickness of less than 1 μm.

In some examples, the intermetallic compound can have a thickness of less than 200 nm. In some examples, the interior metal can include aluminum. In some examples, the intermetallic compound can include $Al_3Ti$. In some examples, the intermetallic compound can be free from discrete oxide particles.

In some examples, the intermetallic compound can include a continuous layer between the interior metal and the exterior titanium portion. In some examples, the intermetallic compound can separate the interior metal from the exterior titanium portion. In some examples, the intermetallic compound can include a discontinuous layer between the interior metal and the exterior titanium portion. In some examples, the interior metal can contact the exterior titanium portion.

According to some examples, a housing for an electronic device includes an exterior titanium portion at least partially defining a first engagement feature and an interior aluminum portion joined to the exterior titanium portion, the interior aluminum portion at least partially defining the first engagement feature. A first surface of the exterior titanium portion defining the first engagement feature can include a first plurality of pores, the first plurality of pores having a first pore density and a first average pore depth. A second surface of the interior aluminum portion defining the first engagement feature can include a second plurality of pores, the second plurality of pores having a second pore density and a second average pore depth. The second pore density can be greater than the first pore density and the first average pore depth can be greater than the second average pore depth.

In some examples, the first pore density is from approximately 8% to 45%; and the first surface has first pore depths from 50 μm to 110 μm and first pore diameters from 50 μm to 110 μm. In some examples, the second pore density is from approximately 30% to 65%; and the second surface has second pore depths from 25 μm to 50 μm.

In some examples, the housing can further include an intermetallic compound disposed between the exterior titanium portion and the interior aluminum portion, the intermetallic compound including $Al_3Ti$. In some examples, the intermetallic compound can include a first layer and a second layer different from the first layer; and the intermetallic compound can have a thickness of less than 500 nm. In some examples, the intermetallic compound can include a continuous layer having a thickness of less than 200 nm. In some examples, the intermetallic compound can include a discontinuous layer having a thickness of less than 150 nm. In some examples, the intermetallic compound can be free from discrete oxide particles.

According to some examples, a housing for a portable electronic device includes a first titanium clad sidewall portion at least partially defining an internal volume and an external surface of the portable electronic device. The first titanium clad sidewall portion can include a metal outer portion and an inner portion bonded to the metal outer portion. The metal outer portion can include a first material having a first set of material properties and the metal outer portion can at least partially define a first engagement feature. The inner portion can include a second material having a second set of material properties independent of the first set of material properties and the inner portion can at least partially define the first engagement feature. A surface of the metal outer portion defining the first engagement feature can have a pore density from approximately 8% to 45%, pore depths from 50 μm to 110 μm, and pore diameters from 50 μm to 110 μm.

In some examples, the housing can further include a moldable material mechanically engaging the first engagement feature. In some examples, the moldable material can be at least partially disposed in the pores in the surface of the metal outer portion.

In some examples, the metal outer portion can include titanium and the inner portion can include aluminum. In some examples, the first titanium clad sidewall portion can further include an intermetallic compound disposed between the metal outer portion and the inner portion and the intermetallic compound can include a continuous layer having a thickness of less than 200 nm. In some examples, the first titanium clad sidewall portion can further include an intermetallic compound disposed between the metal outer portion and the inner portion and the intermetallic compound can include a discontinuous layer having a thickness of less than 150 nm.

In some examples, a surface of the inner portion defining the first engagement feature can have a pore density from approximately 30% to 65% and pore depths from 25 μm to 50 μm.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
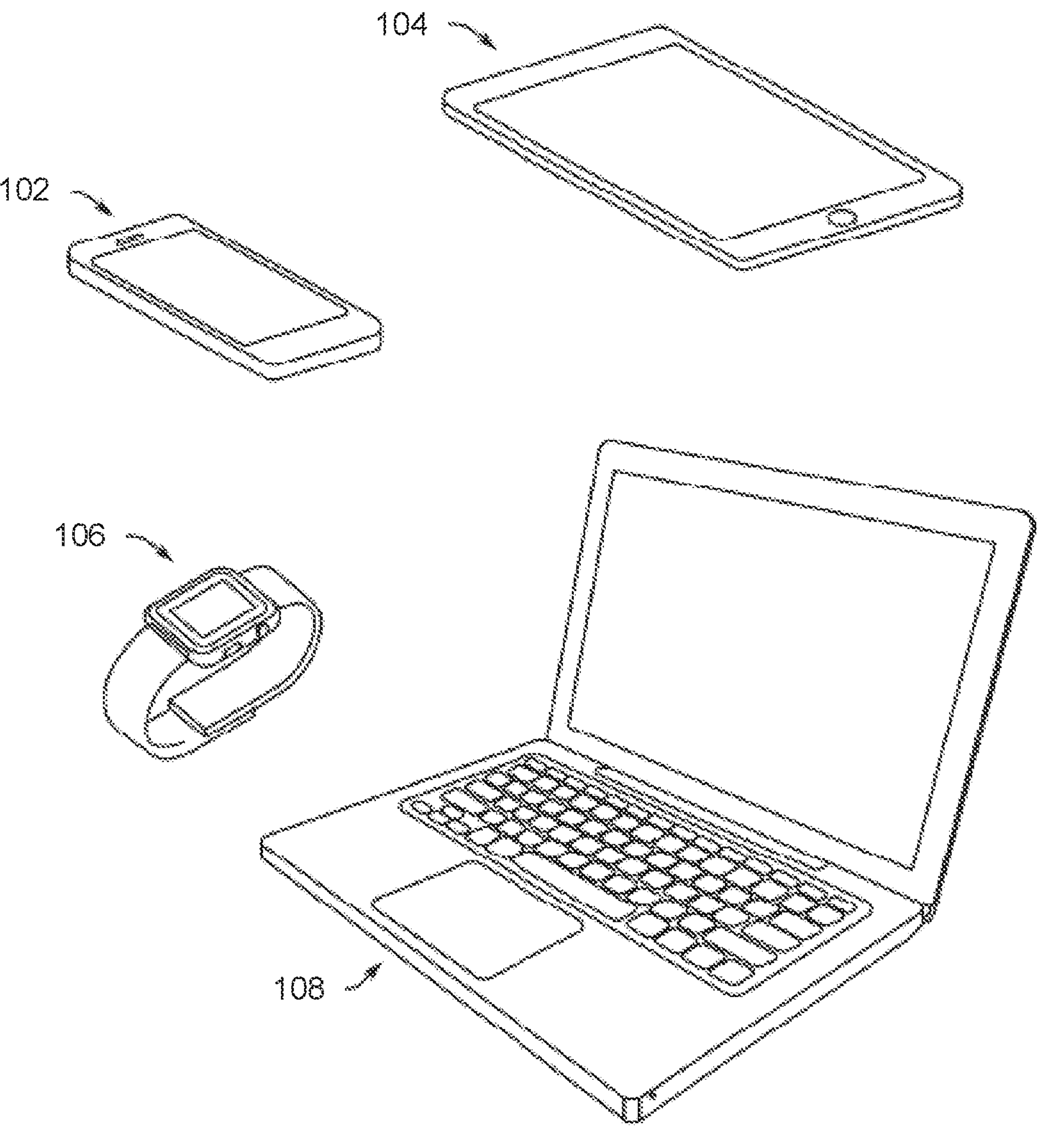
FIG. 1 illustrates electronic devices including housings and enclosures formed with clad materials described herein.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to composite (e.g., clad) housings or enclosures for electronic devices, and methods of forming the same. A composite housing, or component of a housing, can include an exterior or outer portion, also referred to as a shell, having a first set of material properties; and an interior or inner portion, also referred to as a core, having a second, different set of material properties that are independent of the first set of material properties. The exterior portion can include a metallic material, such as titanium. The interior portion can include a metallic material, such as aluminum. The exterior portion and the interior portion can be welded, bonded, adhered, or otherwise joined together such that they form the housing, or a portion thereof, and act as a composite body. In some examples, the composite body can be treated as unitary body with respect to machining, manufacturing, assembly, or other processes. The exterior portion and the interior portion can together define an engagement feature that can mechanically engage with a moldable material positioned at a surface of the composite component, including the outer portion and the inner portion. The moldable material can mechanically engage the engagement feature and join or bond the composite housing to one or more components, mounts, or enclosures.

In some examples, the exterior portion can include a metal that is more corrosion resistant and stronger than the metal of the interior portion. The metal of the exterior portion can also have a desired cosmetic appearance and thermal properties. In some examples, the interior portion can include a different metal that is more environmentally friendly, has a greater supply, is less dense, is easier to machine, and/or is more easy to weld than the metal of the exterior portion. For example, the material and/or geometry of the inner portion can be selected in order achieve a desired level of strength, weight, stiffness, cost, thermal conductivity, electromagnetic transparency, machinability, carbon footprint, recyclability, other properties, or combinations thereof. Meanwhile, the material and/or geometry of the exterior portion can be independently selected in order to achieve any of the above properties or a desired level of hardness, corrosion resistance, scratch resistance, cosmetic finish, other properties, or combinations thereof. Forming the housings of electronic devices of composite materials allows the housings to achieve desirable properties of multiple materials included in the composite materials.

In some examples, the composite material can be formed using processes that minimize a thickness of an intermetallic compound formed between the exterior portion and the interior portion, thereby improving adhesion between the exterior portion and the interior portion. The selected processes can further maximize a respective hardness of the exterior portion and the interior portion. In some examples, the selected processes can include a roll bonding process performed at a reduced temperature, which decreases a thickness of the intermetallic compound. In some examples, the roll bonding process can include heat treatment steps that increase the hardness of the exterior portion and the interior portion, without overly increasing the thickness of the intermetallic compound. In some examples, the selected process can include a pulse laser welding process or a direct metal deposition process.

These and other examples are discussed below with reference to FIGS. 1 through 14. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

Methods described herein can be used to form composite materials (also referred to as clad materials) that have improved adhesion and hardness and are cosmetically appealing for surfaces of enclosures and/or housings for consumer devices. FIG. 1 illustrates example consumer products than can be manufactured using methods described herein. FIG. 1 includes a portable phone 102, a tablet computer 104, a watch 106, and a portable computer 108, which can each include enclosures and/or housings. The devices 102, 104, 106, and 108 can be subject to impact forces such as scratching, dropping, abrading, chipping and gouging during normal use, and can be subjected to conditions that are known to cause corrosion to aluminum, aluminum alloy, and titanium-aluminum composite components. Providing composite materials formed by the methods detailed herein can improve the bond strength, hardness, appearance, thermal properties, weight, corrosion resistance, workability, and the like of components of the devices 102, 104, 106, and 108.

Figure 2:
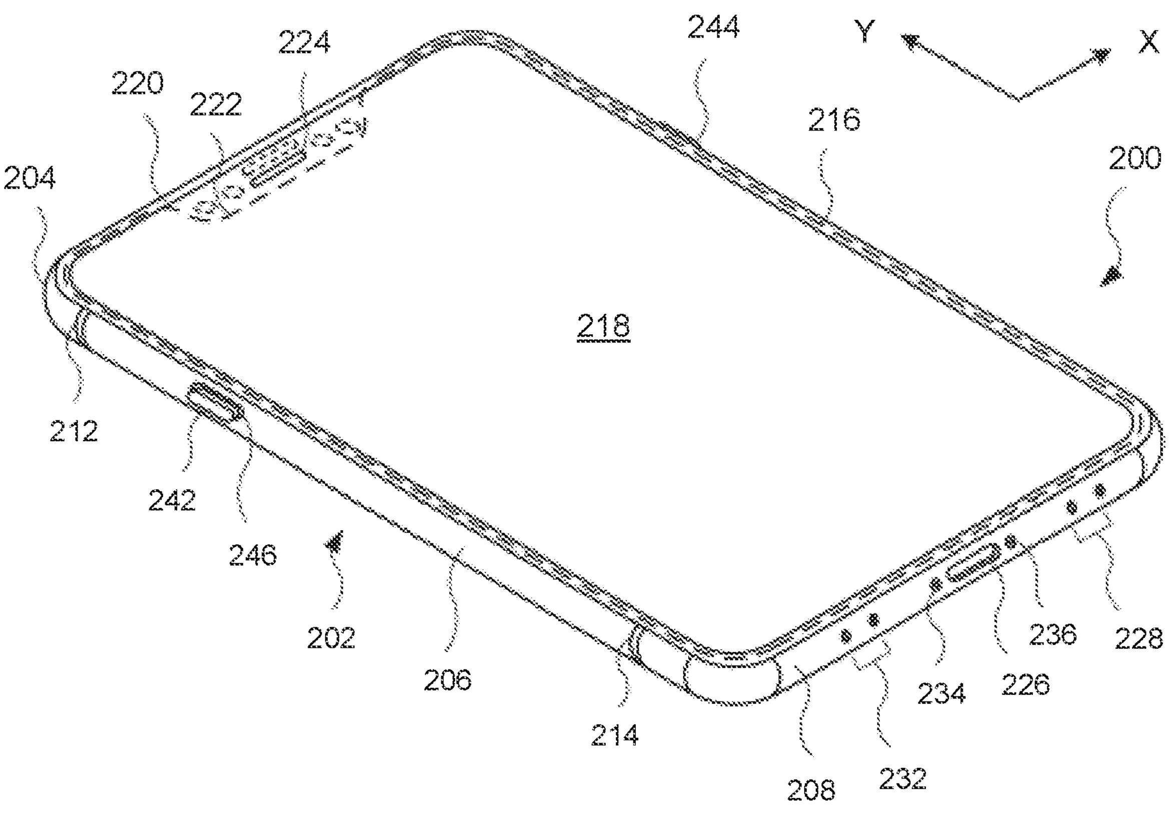
FIG. 2 illustrates a perspective view of an electronic device.

FIG. 2 illustrates a perspective view of an electronic device 200. The electronic device 200 shown in FIG. 2 is a mobile wireless communication device (e.g., a smartphone). The smartphone of FIG. 2 is merely one representative example of a device that can be used in conjunction with the systems and methods disclosed herein. The electronic device 200 can correspond to any form of a wearable electronic device, a portable media player, a media storage device, a portable digital assistant ("PDA"), a tablet computer, a computer, a mobile communication device, a global positioning system (GPS) unit, a remote-control device, or any other electronic device. The electronic device 200 can be referred to as an electronic device or a consumer device.

The electronic device 200 can have a housing that includes a band or a frame 202 that defines an outer perimeter of the electronic device 200. The band 202, or portions thereof, can be or can include a composite component, as described herein. In some examples, the band 202 can include several sidewall components, such as a first sidewall component 204, a second sidewall component 206, a third sidewall component 208 (opposite the first sidewall component 204), and a fourth sidewall component (not shown in FIG. 2). The aforementioned sidewall components can be or can include composite components, as described herein.

In some examples, some of the sidewall components can form part of an antenna assembly (not shown in FIG. 2). As a result, a non-metal material, or materials, can separate the sidewall components of the band 202 from each other, in order to electrically isolate the respective sidewall components. For example, a first separating material 212 separates the first sidewall component 204 from the second sidewall component 206, and a second separating material 214 separates the second sidewall component 206 from the third sidewall component 208. The aforementioned materials can include an electrically inert, or insulating, material(s), such as plastics and/or resin, as non-limiting examples.

The electronic device 200 can further include a display assembly 216 (shown as a dotted line) that is covered by a protective cover 218. The display assembly 216 can include multiple layers, with each layer providing a unique function. The display assembly 216 can be partially covered by a border 220, or frame, that extends along an outer edge of the protective cover 218 and partially covers an outer edge of the display assembly 216. The border 220 can be positioned to hide or obscure any electrical and/or mechanical connections between the layers of the display assembly 216 and flexible circuit connectors. Also, the border 220 can exhibit a uniform thickness. For example, the border 220 can include a thickness that generally does not change in the X- and Y-dimensions.

Also, as shown in FIG. 2, the example display assembly 216 can include a notch 222, representing an absence of the display assembly 216. The notch 222 can allow for a vision system that provides the electronic device 200 with information for object recognition, such as facial recognition. In this regard, the electronic device 200 can include a masking layer with openings (shown as dotted lines) designed to hide or obscure the vision system, while the openings allow the vision system to provide the object recognition information. The protective cover 218 can be formed from a transparent material, such as glass, plastic, sapphire, or similar transparent materials. In this regard, the protective cover 218 can be referred to as a transparent cover, a transparent protective cover, or a cover glass (when the protective cover 218 includes glass). As shown in FIG. 2, the protective cover 218 includes an opening 224, which can represent a single opening of the protective cover 218. The opening 224 can allow for transmission of acoustical energy (in the form of audible sound) into the electronic device 200, which can be received by a microphone (not shown in FIG. 2) of the electronic device 200. Further, the opening 224 can allow for transmission of acoustical energy (in the form of audible sound) out the electronic device 200, which can be generated by an audio module (not shown in FIG. 2) of the electronic device 200. The electronic device 200 may not include, according to some examples, a button, such as "home button," commonly found in electronic devices.

The electronic device 200 can further include a port 226 designed to receive a connector of a cable assembly. The port 226 allows the electronic device 200 to communication data information (send and receive), and allows the electronic device 200 to receive electrical energy to charge a battery assembly. Accordingly, the port 226 can include terminals that electrically couple to the connector.

The electronic device 200 can include several openings. For example, the electronic device 200 can include openings 228 that allow an additional audio module (not shown in FIG. 2) of the electronic device 200 to emit acoustical energy out of the electronic device 200. The electronic device 200 can include openings 232 that allow a microphone of the electronic device to receive acoustical energy. The electronic device 200 can include a first fastener 234 and a second fastener 236 designed to be fastened to a rail that is coupled to the protective cover 218. In this way, the first fastener 234 and the second fastener 236 can be designed to couple the protective cover 218 with the band 202.

The electronic device 200 can include several control inputs designed to provide a command to the electronic device 200. For example, the electronic device 200 can include a first control input 242 and a second control input 244. The aforementioned control inputs can be used to adjust the visual information presented on the display assembly 216 or the volume of acoustical energy output by an audio module, as non-limiting examples. The controls can include one of a switch, a sensor, or a button designed to generate a command to a processor circuit. The control inputs can at least partially extend through openings in the sidewall components. For example, the second sidewall component 206 can include an opening 246 that receives the first control input 242. Further details of an exemplary electronic device are provided below with reference to FIG. 3.

Figure 3:
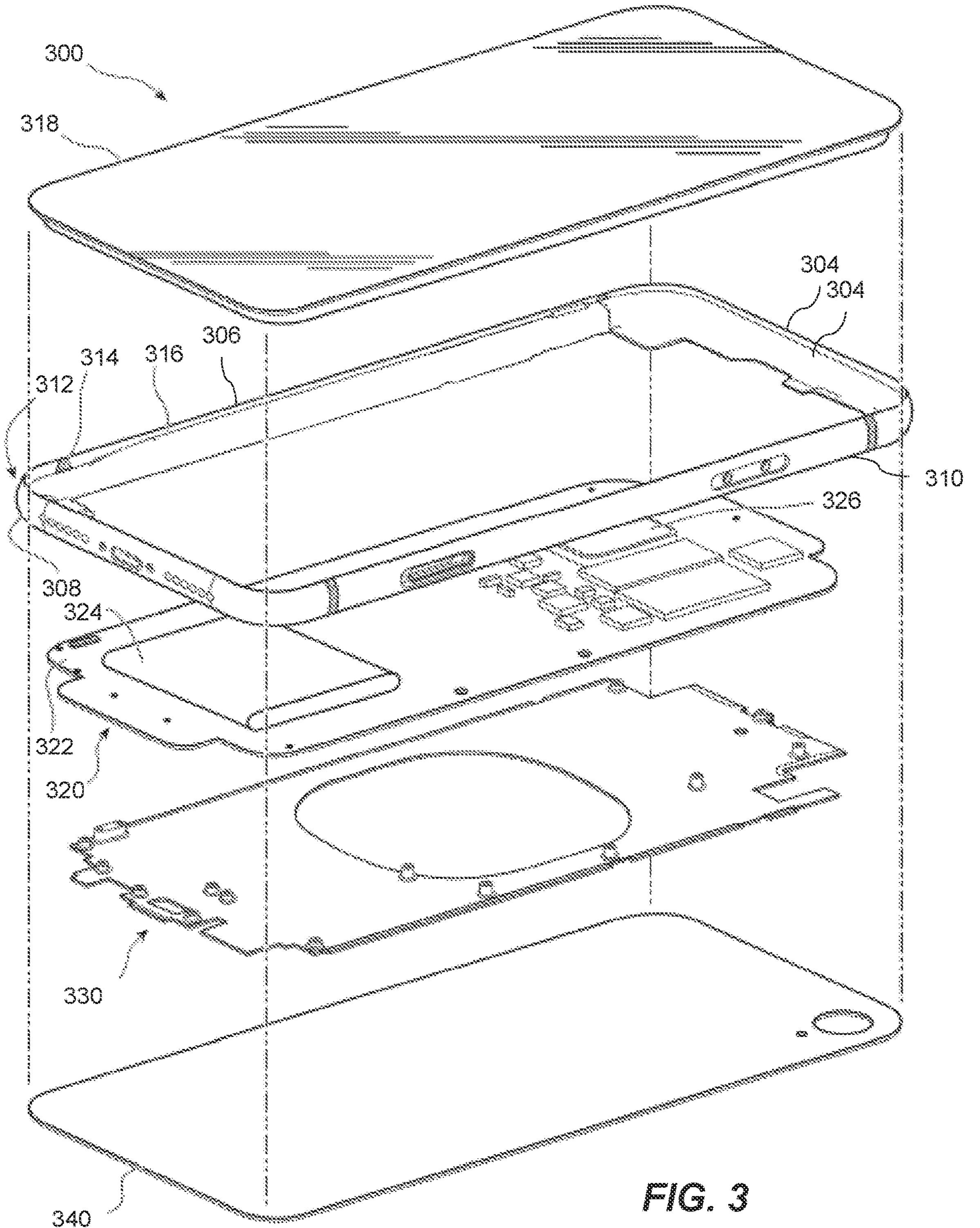
FIG. 3 illustrates an exploded view of an electronic device.

FIG. 3 illustrates an exploded view of an electronic device 300. The electronic device 300 shown in FIG. 3 is a smartphone but is merely one representative example of a device that can include or be used with the systems and methods described herein. As described with respect to electronic device 200, electronic device 300 can also correspond to any form of wearable electronic device, a portable media player, a media storage device, a portable digital assistant ("PDA"), a tablet computer, a computer, a mobile communication device, a GPS unit, a remote-control device, and other electronic devices. In some examples, the electronic device 300 can include some or all of the features described herein, with respect to electronic device 200.

The electronic device 300 can have a housing that includes a band 302 that at least partially defines an exterior portion, such as an outer perimeter of the electronic device 300. As with the band 202 described above in FIG. 2, the band 302 can include several sidewall components, such as a first sidewall component 304, a second sidewall component 306, a third sidewall component 308 (opposite the first sidewall component 304), and a fourth sidewall component 310 (opposite the second sidewall component 306. The aforementioned sidewall components can be or can include a composite component, as described herein. The band 302 can also include a non-metal material or materials that separate and/or join the sidewall components of the band 302 with each other, as described herein. For example, separating material 314 can separate and/or join the second sidewall component 306 with the third sidewall component 308.

The housing, including the band 302, can include one or more features to receive or couple to other components of the device 300, such as a feature 322. For example, the band 302 can include any number of features such as apertures, cavities, indentations, and other mating features configured to receive and/or attach to one or more components of the device 300. The electronic device 300 can include internal components such as processors, memory, circuit boards, batteries, and sensors. Such components can be disposed within an internal volume defined, at least partially, by the band 302, and can be affixed to the band 302, via internal surfaces, attachment features such as the feature 322, threaded connectors, studs, posts, and/or other fixing features, that are formed into, defined by, or otherwise part of the band 302.

The device 300 can include internal components, such as a system in package (SiP) 326, including one or more integrated circuits such as a processors, sensors, and memory. The device 300 can also include a battery 324 housed in the internal volume of the device 300. The device 300 can also include one or more sensors, such as optical or other sensors, that can sense or otherwise detect information regarding the environment exterior to the internal volume of the device 300. Additional components, such as a haptic engine, can also be included in the device 300. The electronic device 300 can also include a display assembly 316, similar to display assembly 216 described herein. In some examples, the display assembly 316 can be received by and/or attached to the band 302 by one or more attachment features.

The electronic device 300 can further include a chassis 320 that can provide structural support. The chassis 320 can include a rigid material, such as a metal, or can include a composite construction, as described herein. The chassis 320 can also be coupled to the band 302. In this manner, the chassis 320 can provide an electrical grounding path for components electrically coupled to the chassis. The electronic device 300 can alternatively or additionally include a back plate 330 having cladding layers and/or other attachment features such that one or more components of the electronic device 300 can be attached to the back plate 330, for example via welding. The back plate 330 can form conductive pathways for connecting components of the electronic device 300. In some examples, the back plate 330 can be attached to the band 302 of the device 300 by one or more attachment features, such as the feature 322.

An exterior surface of the electronic device 300 can further be defined by a back cover 340, which can be coupled with the band 302. In this regard, the back cover 340 can combine with the band 302 to form an enclosure or a housing of the electronic device 300, with the enclosure or housing (including the band 302 and the back cover 340) at least partially defining an internal volume. The back cover 340 can include a transparent material, such as glass, plastic, sapphire, or another transparent material.

The housing, including the band 302 of one or more composite components can be conformable to interior-dimensional requirements, as defined by the internal components. For example, the structure of the housing including a composite band 302 can be defined or limited exclusively or primarily by the internal components the housing is designed to accommodate. That is, because a housing including a composite band 302 can be extremely light and strong, the housing can be shaped to house the interior components in a dimensionally efficient manner, without being constrained by factors other than the dimensions of the components, such as the need for additional structural elements. The composite components 304, 306, 308, 310 of the band 302 can be formed by a variety of processes, as discussed herein. In some examples, these formation processes can allow for the housing and/or band 302 to have a detailed shape or design that is tailored specifically to satisfy one or more needs, such as internal dimensional requirements, without the need for additional features to reinforce the structure of the housing. Additionally, artifacts of the manufacturing process of the housing can be eliminated. Furthermore, other components of the electronic device 300, such as individual internal structural components like the chassis 320 or exterior input components, can be formed from or can include a composite component, as described herein.

While any number or variety of components of an electronic device, for example the electronic device 300, can be formed from or can include a composite component, the structure of these composite components can be, for example, a composite component including an exterior portion joined to an interior portion as described herein. The structure and materials of the exterior and interior portion, as well as the composite component itself, can apply not only to the specific examples discussed herein, but to any number or variety of examples in any combination. Various examples of composite components are described below with reference to FIG. 4.

Figure 4:
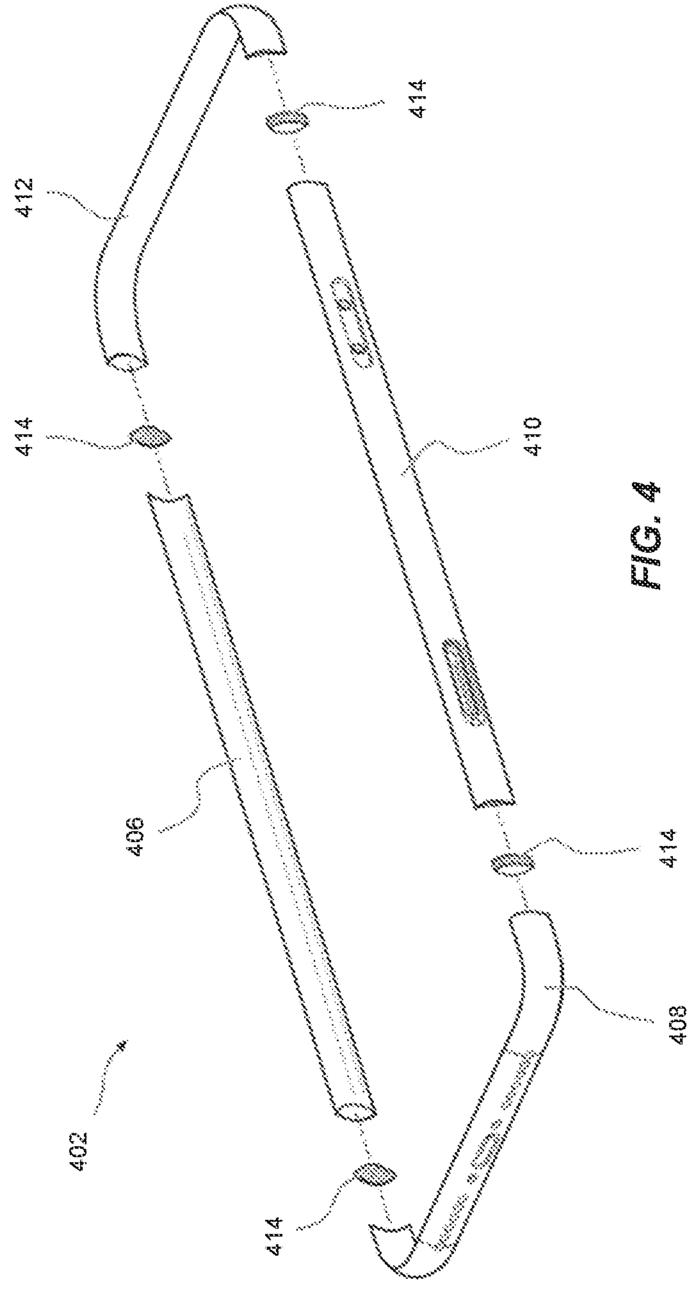
FIG. 4 illustrates an exploded view of a housing of an electronic device.

FIG. 4 illustrates an exploded view of a band 402 of a housing or enclosure of an electronic device, for example electronic devices 102, 104, 106, 108, 200, or 300 described with respect to FIGS. 1 through 3. The band 402 can include one or more portions that are composite components or that include composite components, such as an exterior portion joined to an interior portion, as described herein. For example, the band 402 can include a first composite sidewall component 406, a second composite sidewall component 408, a third composite sidewall component 410 (opposite the first composite sidewall component 406), and a fourth composite sidewall component 412 (opposite the second composite sidewall component 408). In some examples, and as described herein, the composite components 406, 408, 410, 412 can be separated and/or joined together by a material 414 that can include an electrically inert, or insulating, material(s), such as plastics and/or resin, as non-limiting examples.

Although the embodiment illustrated in FIG. 4 includes a band 402 having multiple composite sidewall components 406, 408, 410, 412 that are joined together, in some examples, a housing or enclosure for an electronic device can include or be formed form a single composite component having an interior and an exterior portion as described herein. Further, in some examples the composite components can form portions of the housing or enclosure other than the sidewalls, such as a top portion, a bottom portion, or any portion of the housing or enclosure. Further details of the composite sidewall components 406, 408, 410, 412 are provided below.

Figures 5, 6:
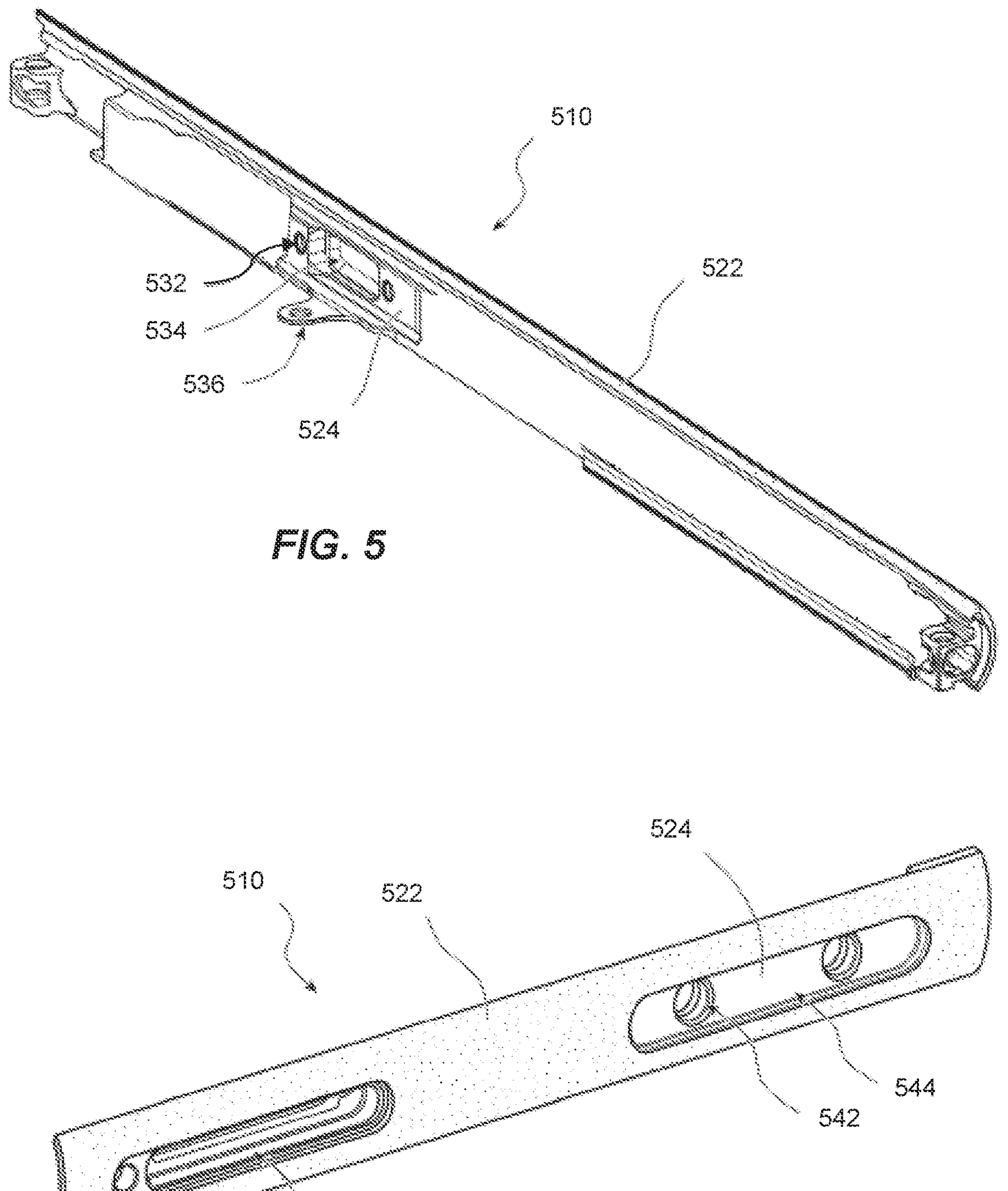
FIG. 5 illustrates a perspective view of a portion of a housing of an electronic device.
FIG. 6 illustrates a perspective view of a portion of a housing of an electronic device.

FIG. 5 illustrates a perspective view of a composite component 510 that can be similar to, or can include, the features of the composite sidewall components 404, 406, 408, 410 described with respect to FIG. 4. The composite component 510 can include an outer or exterior portion 522 that is joined to an inner or interior portion 524. In the present example, the exterior portion 522 can at least partially define an exterior surface of a housing or enclosure of an electronic device. The interior portion 524 can at least partially define a surface of an internal volume of the electronic device. As can be seen in FIG. 5, the composite component 510 can include a number of features 532, 534, 536, that can, for example, act as attachment features for other components of an electronic device.

In some examples, the features can be formed in one or both of the exterior portion 522 and the interior portion 524 of the composite component 510. For example, the interior portion 524 of the composite component 510 can include a feature, such as aperture 532. In some examples, the feature 532 can be an aperture, a recess, a blind hole, or other feature formed in the interior portion 524 by a subtractive process, such as a machining or an etching process. In some examples, the feature 532 can act as an attachment feature for other components of the electronic device. The feature 532 can be configured to receive components of an electronic device, such as buttons or input components. Although depicted as an aperture 532, the feature 532 can take any desired form or shape. In some examples, the feature 532 can extend, at least partially, into the interior portion 524 to a desired depth. Alternatively, however, the feature 532 can extend substantially entirely through an entire thickness of interior portion 524.

In some examples, a feature can be formed in both the exterior portion 522 and the interior portion 524 of the composite component 510. For example, feature 534 can be formed in, or can be defined by, both the exterior and the interior portions 522, 524 of the component 510. Feature 534 can be an aperture or a through hole that passes at least partially through the exterior portion 522 and the interior portion 524. Further, although the portions 522, 524 are illustrated as having a relatively uniform thickness, in some examples, the thickness of the exterior portion 522 and/or interior portion 524 can vary at locations where features, such as feature 534, are formed. A protruding feature, such as feature 536, can be formed in the interior portion 524, for example, by a machining process or an additive manufacturing process, and can serve as an attachment feature for other components of an electronic device. Although depicted as a protrusion defining an aperture there through, the feature 536 can include any desired shape or design.

As described herein, the interior portion 524 of the composite component 510 can be selected such that it has a set of material properties that are desirable for the formation of features, such as features 532, 534, 536. For example, the material of the interior portion 524 can be selected to have a material property or set of material properties that allow for the interior portion 524 to be machinable without causing high levels of wear on machining tools, and/or workable, such as easy to weld. Additionally, the material of the interior portion 524 can be relatively inexpensive so that waste material produced by forming the features does not substantially increase production costs. The material of the interior portion 524 can be selected to be environmentally friendly, such as a recycled material. Further, as described herein, the material of the exterior portion can be selected to have a material property or set of material properties, independent of the material properties of the interior portion 524, which allow the exterior portion 522 to have, for example, high levels of hardness and corrosion resistance. The material of the exterior portion 522 can be selected to have a desired cosmetic appearance, thermal properties, and the like.

In some examples, the features formed in one or both of exterior portion 522 and interior portion 524, such as features 532, 534, 536, can have a major dimension from about a micron up to about a millimeter, or several millimeters or more. In some cases, a feature, such as feature 536 can have a major dimension from about 100 microns to about 1 millimeter. Further, in some examples, a feature, such as feature 536, can have minor dimensions from about 100 microns to about 1 millimeter.

Further, as can be seen in FIG. 5, the exterior portion 522 can have a substantially curved shape or profile that can correspond to an exterior profile of the electronic device. The exterior portion 522 can have any desired shape or profile. In some examples where the exterior portion has a substantially curved shape or profile, the interior portion 524 can be positioned entirely behind or within a curve defining the curved profile of the exterior portion 522. Additional details of the exterior portion 522 are provided below with reference to FIG. 6.

FIG. 6 illustrates a perspective view of the composite component 510 of the housing of FIG. 5. As can be seen in FIG. 6, one or more areas, such as area 538, of the exterior portion 522, can be removed so that at least some of the interior portion 524 can be exposed. The exposed surface of the interior portion 522 can be subjected to a treatment or other processing in order to, for example, protect the exposed surface of the interior portion 522. In some examples, the exterior portion 522 can include titanium or a titanium alloy and the interior portion 524 can include aluminum. At area 538, where the aluminum of the interior portion 524 is externally exposed, an interface between the titanium of the exterior portion 522 and the aluminum of the interior portion 524 can also be exposed.

In such examples, the interface between the materials of the two portions can form a galvanic contact and one of the materials of the portions 522, 524 can be subjected or prone to galvanic corrosion. Accordingly, areas, such as area 538, where an interface between the materials of the portions 522, 524 is exposed can be processed or treated to prevent or inhibit galvanic corrosion. A material or materials can be deposited over the interface between the portions 522, 524 at area 538 to prevent or inhibit galvanic corrosion. Example materials can include, but are in no way limited to, a polymeric material, a metallic material, a ceramic material, or combinations thereof.

Alternatively, the geometry of the exterior portion 522 and/or interior portion 524 can be designed so that an interface between the portions is not exposed, even when features such as feature 538 are formed in the exterior portion 522. For example, the exterior portion 522 can be thicker at the area 538 where a feature is formed so that the interior portion 524 is not exposed, even when material is removed from the exterior portion 524. The interior portion 524 can correspondingly be made thinner at areas where the exterior portion 522 has an increased thickness, so that the composite component 510 maintains a relatively uniform thickness.

Figure 7:
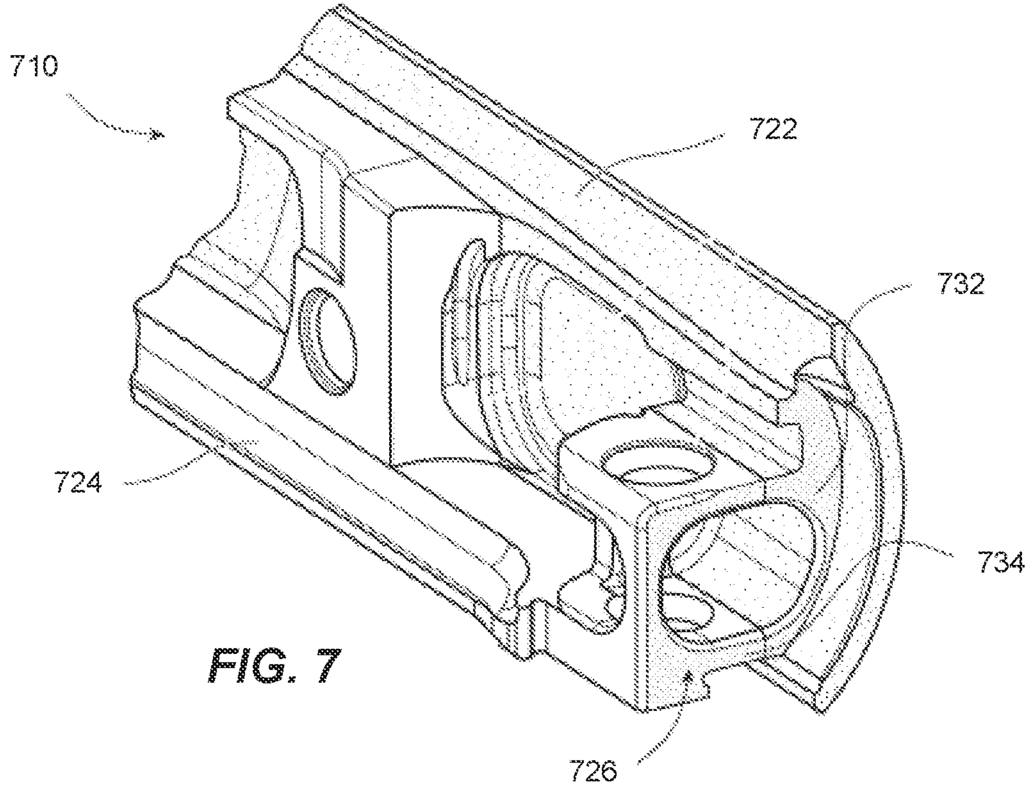
FIG. 7 illustrates a close-up perspective view of a portion of a housing of an electronic device.

FIG. 7 illustrates a perspective view of a portion of a composite component 710 that can include a pre-formed exterior portion 722 joined to an interior portion 724. The composite component 710 can include a surface 726 that is defined by both the exterior portion 722 and the interior portion 724. Although the surface 726 is depicted as including an approximately equal area defined by each portion, in some examples, one of the interior or exterior portions 722, 724 can define substantially more of the surface 726 than the other portion.

The surface 726 can include one or more engagement features formed thereon. For example, the surface 726 can include multiple engagement features 732 formed on the part of the surface defined by the exterior portion 722, and multiple engagement features 734 formed on the part of the surface defined by the interior portion 724 (e.g., the surface 726 can include an area of engagement features 732 and an area of engagement features 734). As described herein, the engagement features 732, 734 can range in size from nano- or micro-scaled features to macro-scale features having dimensions on the order or millimeters. In some examples, the engagement feature 732, 734 can have any desired shape to engage a moldable material, as described herein. For example, an engagement feature can include a recess, a protrusion, or combinations thereof. In some examples, the surface 726 can be subjected to various processes, such as machining, etching, deposition, or the like, in order to form the engagement feature 732, 734 across an area of the surface 726.

In some examples, the engagement features 732, 734 can allow the composite component 710 to be joined to a second component by mechanical engagement with a moldable material. For example, a moldable material can mechanically engage the engagement features 732, 734 to join the component 710 with a component, such as component 408, illustrated and described with respect to FIG. 4.

In some examples, the engagement features 732, 734 can include shapes such that moldable material can flow or be provided into or around the engagement features 732, 734. In some examples, the engagement features 732, 734 can be such that upon cooling, curing, hardening, or otherwise solidifying, the moldable material mechanically engages the engagement features 732, 734 to retain the moldable material on the composite component 710.

In some examples, the engagement features 732, 734 can be formed on or in the surface 726 of the composite 710 component defined by the interior portion 724 and the exterior portion 722 by any number of additive or subtractive processes. Formation of the engagement features 732, 734 can include a subtractive process such as machining, etching, laser-based processes, cutting, grinding, and other subtractive processes. In some examples, the engagement features 732, 734 can be formed by an additive process, such as a deposition process, a spraying process, a 3D printing process, and other similar additive processes. Alternatively, multiple processes can be used to form the engagement features 732, 734.

Figure 8:
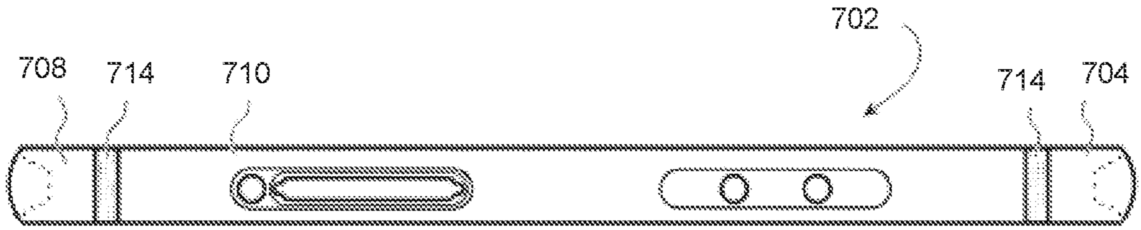
FIG. 8 illustrates a profile view of a housing of an electronic device.

FIG. 8 illustrates a band 702 that includes the composite component 710, as described above. In some examples, the composite component 710 can include multiple surfaces defined by the exterior portion 722 and the interior portion 724. For example, the composite component 710 can include a second surface (not shown) opposite the surface 726 that is substantially similar and that also includes engagement features formed thereon. Further, one or more other components of the band 702, such as components 704 and 708, can similarly include engagement features formed on a surface defined by an exterior portion and an interior portion. As shown, a moldable material 714 is disposed between the composite component 710 and the components 704, 708 to which it is joined. The moldable material 714 can include a polymer material, such as epoxy or resin, and can be an electrically insulating material. The moldable material 714 is mechanically engaged with the engagement features 732, 734 of the composite component 710 and can similarly be mechanically engaged with engagement features of the components 704, 708. In this way, the moldable material 714 can serve to join the composite component 710 to the additional components 704, 708, and thereby form the band 702.

In some examples, the composite component 710 including the engagement features 732, 734 can be joined to the additional components 704, 708 including engagement features by the moldable material 714 that engage the engagement features of both the composite component 710 and the additional components 704, 708. In some examples, multiple composite components can be joined to form a housing, enclosure, or frame of an electronic device as described herein. The moldable material 714 can include any desired material and can, in some examples, include an electrically insulating material or an electromagnetically transparent material. In some examples, the moldable material 714 can serve to electrically isolate the composite component 710 from the additional components 704, 708.

Figure 9:
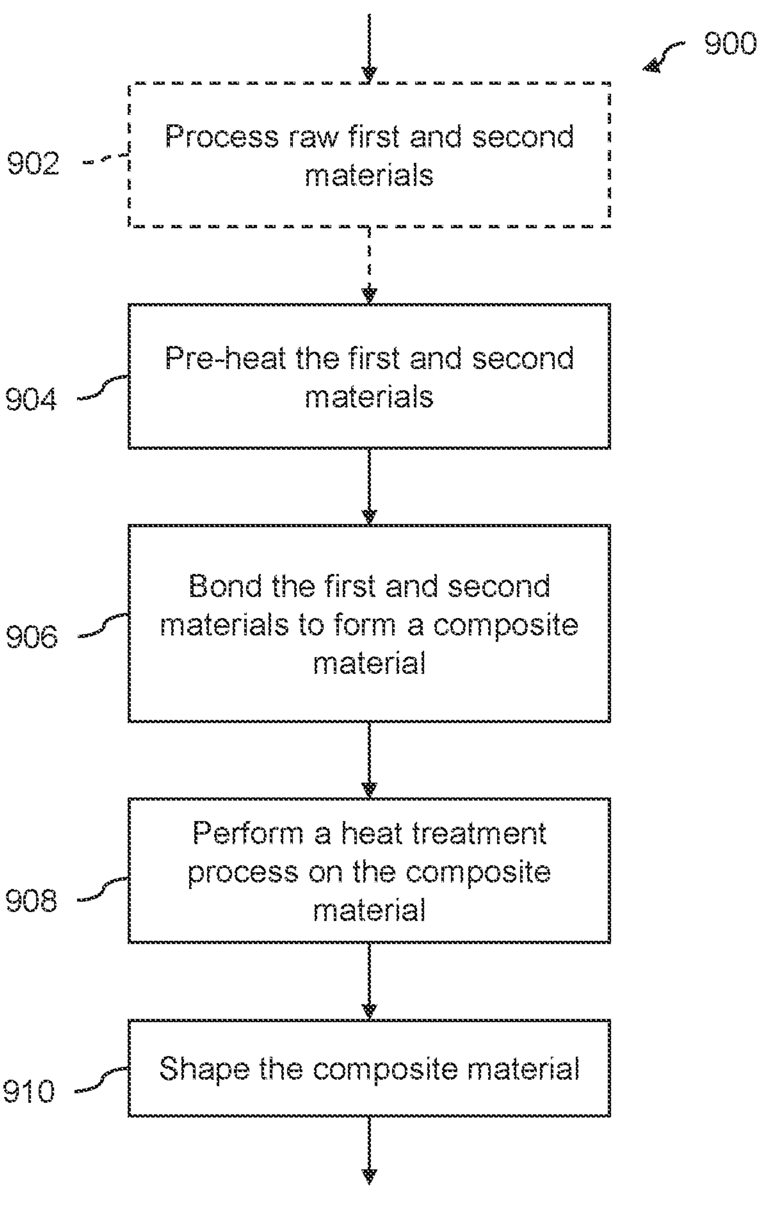
FIG. 9 illustrates a flow diagram of a method of forming a clad material with roller bonding.

FIG. 9 is a flow chart of a method 900 for forming a composite material that can be used in a composite component, as described herein. The composite material can also be referred to as a clad material. In the method 900 of FIG. 9, the composite material is formed by roll bonding. At step 902, various pre-processing steps are performed on a raw first material and a raw second material. The first material can include titanium, a titanium alloy, stainless steel, or the like. The second material can include aluminum or the like. The pre-processing steps can be used to shape and/or purify the raw first and second materials prior to the first and second materials being joined to one another to form the composite material. Step 902 is optional and can be omitted depending on shapes and purities of the first and second materials.

In some examples, step 902 can include one or more vacuum arc remelting (VAR) processes. For example, step 902 can include two VAR processes. The VAR processes can be used on the first material and can be used to improve the quality and purity of the first material.

Various processes can be used to shape the first material. For example, the first material can be shaped into a flat bar with desired dimensions before the first and second materials are joined. The first material can be formed into a billet by forging. The forging can be performed at relatively high temperatures. The first material can then, according to one example, be shaped into a wire rod by rolling. In this example, multiple rolling processes can be used to shape the first material into a wire rod, and to reduce the diameter of the wire rod. The first material can also be shaped into a flat bar by drawing. The rolling to form the first material into a wire rod and the drawing to form the first material into a flat bar can be performed at relatively high temperatures. In some examples, guide rollers can be incorporated in the shaping processes of the first material to improve dimensional symmetry. In some examples, the corner radius of the flat bar can be reduced by drawing and/or peeling to reduce edge breaks.

The surface of the first material can then be prepared based on a desired finish or cosmetic appearance of the composite component. For example, the surface preparation processes can be used to produce different finishes in the composite material. The surface preparation processes can include brushing, blasting, polishing, combinations or multiples thereof, or the like. Step 902 can include the same, similar, or equivalent processes performed on the second material.

At step 904, the first material and a second material are pre-heated. In some examples, the pre-heating of step 904 can include high frequency (HF) induction heating, followed by heating in a furnace. Following the HF induction heating, the first material can be heated to a lower temperature relative to the temperature of the second material. Similarly, following the heating in the furnace, the first material can be heated to relatively lower temperature than the second material. The first material can be heated to a first temperature by the HF induction heating, and heated to a second, greater temperature by the heating in the furnace. The first and second temperatures to which the first material are heated can be relatively lower than conventional processes. The second material can be heated to a first temperature by the HF induction heating, and heated to a second, lower temperature by the heating in the furnace. Reducing a temperature to which the first material is heated after the HF induction heating and after the heating in the furnace can improve bonding strength between the first material and the second material.

Step 904 can be performed in an inert environment, which is sealed from air, contains an inert gas, and includes oxygen monitoring. This can prevent alpha case (a hard and brittle oxygen-enriched surface phase that occurs when titanium and its alloys are exposed to heated air or oxygen that often includes micro-cracks) from being formed in the first material. Pickling and/or peeling processes can be used to remove alpha case from the first material. Annealing processes of the first material can be minimized (e.g., by reducing temperatures or omitting annealing processes) in order to prevent alpha case from being formed. This can result in reduced delamination of the first material and the second material when the first and second materials are joined to form a composite material, as well as reduced edge breaks between the first and second materials in the composite material.

At step 906, the first and second materials are joined together and bonded to form a composite material. In the method 900, the first and second materials can be joined by a process such as roll bonding. For example, the first material and the second material can be passed through a pair of flat rollers at a high pressure in order to bond the first and second materials to form the composite material. The roll bonding process can be followed by subsequent shaping processes, such as stretching or leveling processes performed by passing the composite material through additional rollers or applying tension to the length of the composite material. The composite material can include an inner portion formed of the second material (e.g., aluminum or the like), and an outer portion formed on opposite sides of the inner portion and formed of the first material (e.g., titanium, titanium alloy, stainless steel, or the like). In other words, the composite material can include the second material sandwiched by the first material. In some examples, the composite material can include one layer of the first material adjacent to one layer of the second material.

In step 908, a heat treatment process is performed on the composite material. In some examples, the heat treatment process can include multiple heat treatment processes, such as a first heat treatment and a second heat treatment. Performing the first heat treatment at different temperatures for different durations can impact the formation of an intermetallic compound between the first material and the second material. For example, performing the first heat treatment at a high temperature for a long duration can result in two IMCs (e.g., two layers of IMCs, such as a first IMC layer and a second IMC layer including a material different from the first IMC layer) being formed between the first material and the second material, with thicknesses of about 300 nm and 200 nm. In some examples, the first IMC layer and the second IMC layer can have different titanium and aluminum ratios. Performing the first heat treatment at a moderate temperature for a long duration can result in a single continuous IMC being formed between the first material and the second material, with a thickness of about 200 nm. Performing the first heat treatment at a low temperature for a long duration can result in a single discontinuous IMC being formed between the first material and the second material, with a thickness of about 100 nm. Performing the first heat treatment at a low temperature for a short duration can result in a single discontinuous IMC being formed between the first material and the second material, with a thickness of about 150 nm. Higher temperature, longer duration, increases hardness, decreases bond strength. Lower temperature, shorter duration, decreases hardness, increases bond strength.

In one example, the first heat treatment can be a T4 temper and can be used to optimize an interface quality between the first material and the second material. The first heat treatment can be followed by a second heat treatment, which can, according to one embodiment, be a T6 temper. The second heat treatment can increase the strength of the first material and/or the second material. Various leveling and/or shaping processes can be performed before, between, and after the first and second heat treatments. For example, a roller leveling process can be performed on the composite material after the first heat treatment, and a 3-point leveling process can be performed on the composite material after the second heat treatment. In some examples, the leveling processes can be used to correct for any warpage or deformation occurring in the composite material as a result of the heat treatment processes.

At step 910, the composite material is shaped. In some examples, the shaping may include a double disk grinding process, a U-bending process, a forging process, combinations thereof, or the like. The double disk grinding process can remove material of the composite material, such as to remove alpha case formed in the composite material. In some examples, the double disk grinding process can be performed to remove from about 10 μm to about 15 μm, from about 5 μm to about 20 μm, from about 0 μm to about 5 μm, or the like of material from the composite material. Removing alpha case can prevent edge breaks and delamination in the composite material. The U-bending and forging processes can be warm processes performed at elevated, but relatively low temperatures. The U-bending process can be performed to shape the composite material into a U-shape. The U-bending process can be performed after the heat treatment process, such as after the second heat treatment. The composite material can include a layer of the second material between layers of the first material, and each layer of material can have a continuous U-shape, including around corners of the U-shape. The forging process can be used to create various features in the composite material, such as the features discussed above with respect to FIGS. 1 through 8.

Figure 10A:
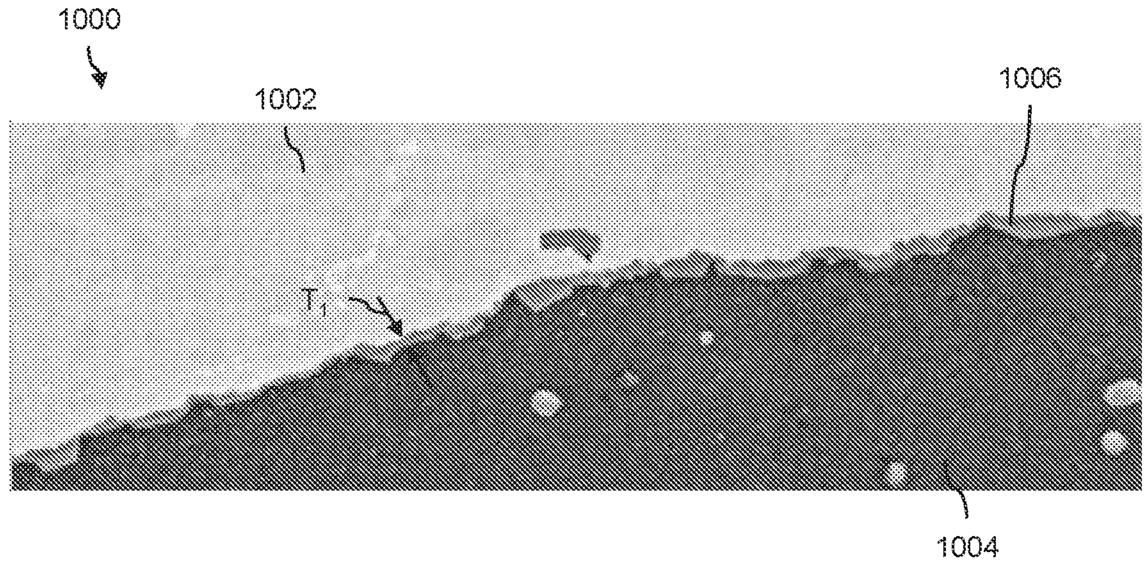
FIGS. 10A and 10B illustrate microscopic cross-sectional views of a clad material.
Figure 10B:
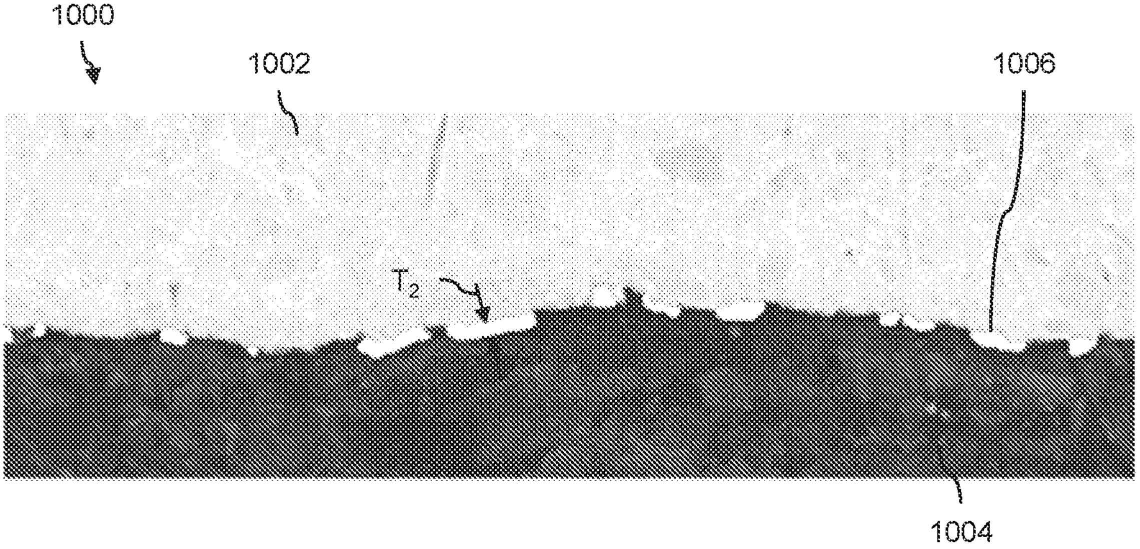

FIGS. 10A and 10B illustrate microscopic cross-sectional views of a composite material 1000. The composite material 1000 includes a first material 1002, a second material 1004, and an intermetallic compound 1006 between the first material 1002 and the second material 1004. The intermetallic compound 1006 can be an alloy or the like and can include metals from the first material 1002 and the second material 1004. In some examples, the first material 1002 can include titanium, a titanium alloy, stainless steel, or the like. The second material 1004 can include aluminum or the like. In some examples, the intermetallic compound 1006 can include $Al_3Ti$, $Ti_3Al$, or the like. In some examples, the intermetallic compound 1006 can have a gradient concentration of the first material and the second material, and a ratio of the first material to the second material can vary from particle to particle within the intermetallic compound 1006. In some examples, the intermetallic compound 1006 can include TiAl adjacent to the first material 1002 and $Al_3Ti$ adjacent to the second material 1004. A continuous magnesium oxide layer can be formed in the intermetallic compound 1006 between the first and second materials 1002, 1004. A silicon concentration can be increased in the first material 1002 near the intermetallic compound 1006.

The intermetallic compound 1006 can be a continuous layer separating the first and second materials 1002, 1004 (illustrated in FIG. 10A); or a discontinuous layer, such that the first and second materials 1002, 1004 contact one another (illustrated in FIG. 10B). In the continuous layer example of FIG. 10A, the intermetallic compound 1006 can have a relatively small thickness $T_1$, such as less than about 1 μm, less than about 500 nm, less than about 200 nm, less than about 150 nm, less than about 100 nm, in a range from about 0.01 nm to about 100 nm, from about 50 nm to about 200 nm or the like. In the discontinuous layer example of FIG. 10B, the intermetallic compound 1006 can have a relatively small thickness $T_2$, such as less than about 1 μm, less than about 500 nm, less than about 200 nm, less than about 150 nm, less than about 100 nm, in a range from about 0.01 nm to about 100 nm, from about 50 nm to about 200 nm or the like. Minimizing the thickness of the intermetallic compound 1006 can improve adhesion between the first and second materials 1002, 1004. Forming the composite material 1000 by rolling or the like can reduce the thickness of the intermetallic compound 1006 and improve adhesion between the first and second materials 1002, 1004. Further, the intermetallic compound 1006 can be free from discrete oxide particles, which can further improve bonding between the first and second materials 1002, 1004.

Figure 11:
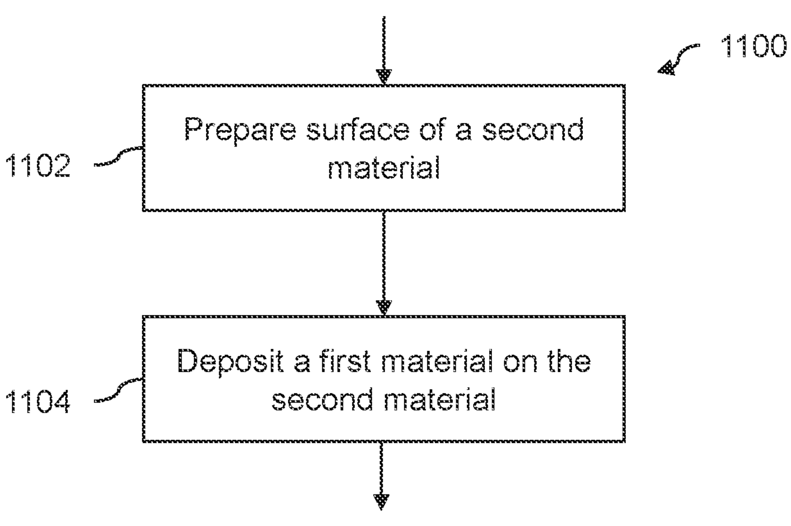
FIG. 11 illustrates a flow diagram of a method of forming a clad material with direct metal deposition.

FIG. 11 is a flow chart of a method 1100 for forming a composite material that can be used in a composite component, as described herein. The composite material can also be referred to as a clad material. In the method 1100 of FIG. 11, the composite material is formed by direct metal deposition. For example, a first material can be formed over a second material by melting the first material onto the second material. The first material can include titanium, a titanium alloy, stainless steel, or the like. The second material can include aluminum or the like.

At step 1102, a surface of the second material can be prepared. This can include various surface modifications, such as sand blasting, sand blasting combined with drilling holes in the surface, laser texturing (such as with a line pattern, or a dot pattern, which may include 20 μm holes, 2.0 mm vertical holes, or the like), combinations thereof, or the like. In an example in which the surface modification includes sand blasting, the surface can have a surface roughness of about 0.96 Sa (or from about 0.85 to about 1.05 Sa) and a surface roughness of about 1.21 Sq. (or from about 1.10 to about 1.30 Sq.). In an example in which the surface modification includes laser texturing with a line pattern, the surface can have a surface roughness of about 2.67 Sa (or from about 2.40 to about 2.90 Sa) and a surface roughness of about 3.85 Sq. (or from about 3.50 to about 4.20 Sq.). In an example in which the surface modification includes laser texturing with a hole pattern, the surface can have a surface roughness of about 0.97 Sa (or from about 0.90 to about 1.10 Sa) and a surface roughness of about 2.26 Sq. (or from about 2.00 to about 2.50 Sq.). Performing surface modifications on the surface of the second material can improve adhesion between the first material and the second material and can be used to provide a desired surface texture and cosmetic finish.

At step 1104, the first material is deposited on the surface of the second material. In some examples, the first material can be deposited from titanium wire, titanium powder, or the like, and can be deposited on the second material, which can include an aluminum substrate. Depositing the first material on the second material by direct metal deposition can result in improved material utilization, have 5-axis capabilities (e.g., can be capable of creating desired shapes/profiles of the first material on the second material), can have multi-material capabilities (e.g., can be used to deposit a range of first materials on a range of similar or dissimilar second materials), can be used to create additive features on the second material, and can be used for repairs of the second material. However, depositing the first material on the second material by direct metal deposition can have relatively poor adhesion of the first material to the second material, and can result in warpage, cosmetic challenges, or other distortion of the second material.

In some examples, a relatively thick intermetallic compound can be formed between the first and second materials. The intermetallic compound can include complex metal oxides, and a heat-affected zone can be formed around the intermetallic compound (e.g., in portions of the second material adjacent the intermetallic compound and the first material). This can negatively impact material properties of the composite material formed by the method 1100.

In some examples, the second material can include 6000 series aluminum and the first material can include Ti64. The composite material can include a titanium melt pool and $Al_3Ti$ intermetallic grains that grow into the aluminum substrate. The intermetallic compound can have a thickness in a range from about 1 μm to about 2 μm. Oxides can be present in the second material, which can decrease pull strength for the composite material.

In some examples, the second material can include 7000 series aluminum and the first material can include Ti64. The composite material can include a titanium melt pool, $Al_3Ti$ intermetallic grains that grow into the aluminum substrate, and re-crystallized grains of the aluminum substrate adjacent the intermetallic compound. The intermetallic compound can have a thickness in a range from about 0.2 μm to about 0.3 μm. The composite material can be relatively free from oxides, which can increase pull strength for the composite material.

Figure 12:
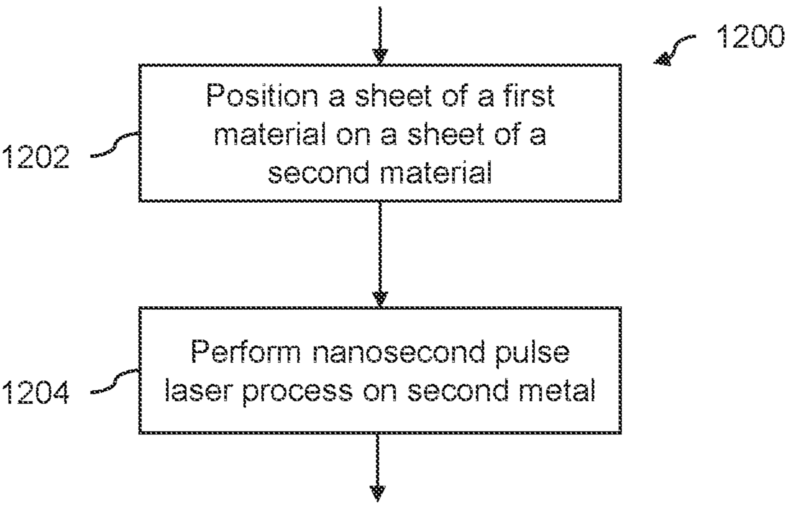
FIG. 12 illustrates a flow diagram of a method of forming a clad material with nanopulse laser welding.

FIG. 12 is a flow chart of a method 1200 for forming a composite material that can be used in a composite component, as described herein. The composite material can also be referred to as a clad material. In the method 1200 of FIG. 12, the composite material is formed by nanopulse laser welding. At step 1202, a sheet of a first material can be positioned on or adjacent to a sheet of a second material. The first material can include titanium, a titanium alloy, stainless steel, or the like. The first material can have a thickness up to about 0.5 mm. The second material can include aluminum or the like.

At step 1204, a nanosecond pulse laser welding process is performed on the first material to bond the first material to the second material. The nanopulse laser welding can produce small rivet melt pools at each location pulsed by the laser, while creating minimal intermetallic compounds between the first material and the second material. In some examples, nanopulse laser welding can be used to stiffen the second material by joining it to the stiffer first material, while retaining a desired cosmetic finish. A distribution of weld locations on the first and second materials and weld densities can be altered to minimize warpage of the first and second materials and maximize the strength of bonding between the first and second materials.

Figures 13A, 13B, 13C, 13D, 13E:
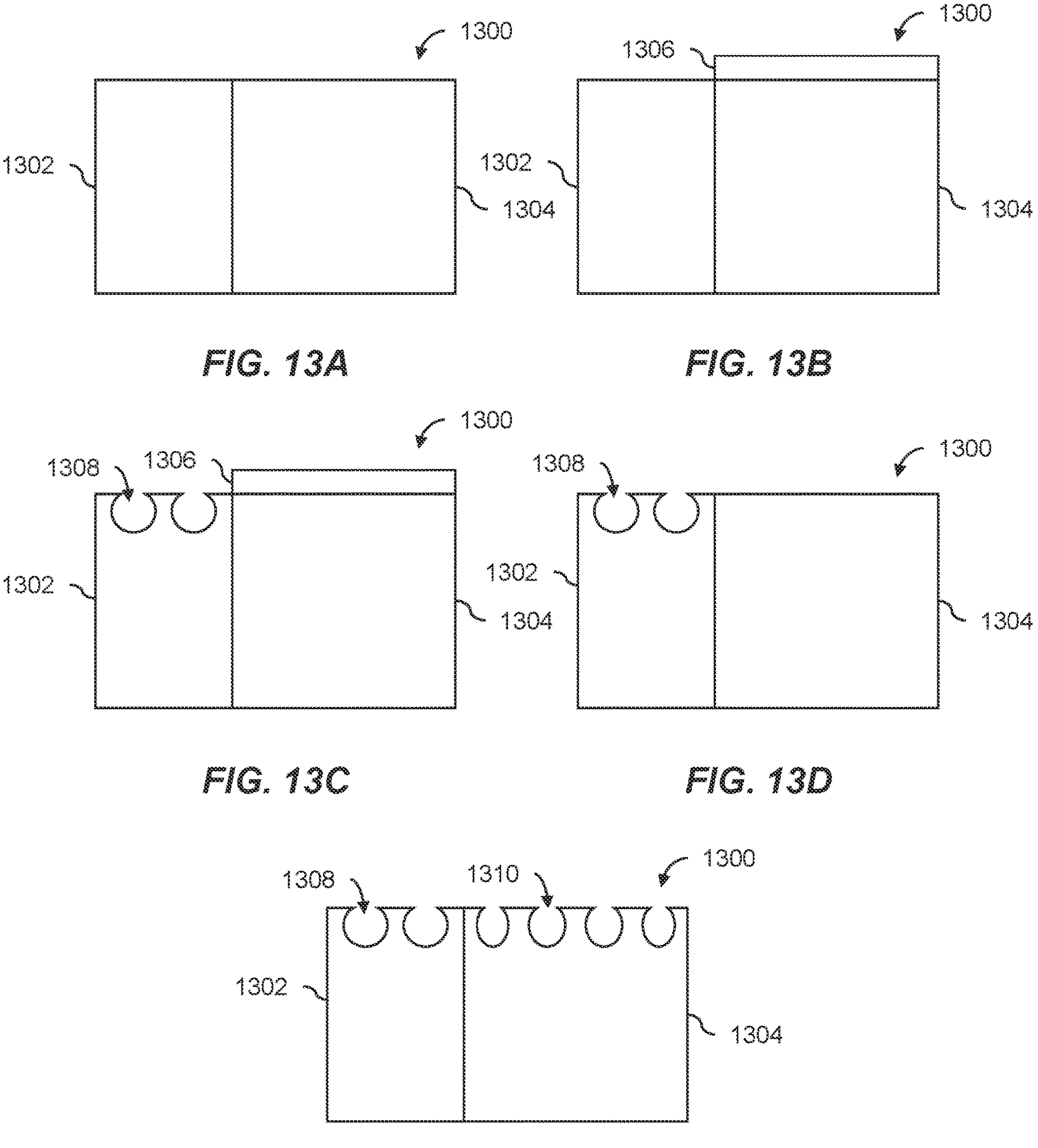
FIGS. 13A, 13B, 13C, 13D, and 13E illustrate cross-sectional views of a method of etching a clad material.

FIGS. 13A through 13E illustrate cross-sectional views of a method of etching a composite material 1300 including a first material 1302 and a second material 1304. FIG. 13A illustrates the composite material 1300 including the first material 1302 bonded to the second material 1304. The first material 1302 can include titanium, a titanium alloy, stainless steel, or the like. The second material 1304 can include aluminum or the like. The second material 1304 can include a metallic material that is relatively easier to etch than a metallic material of the first material 1302.

In FIG. 13B, a protective layer 1306 is formed over the second material 1302. In some examples, the protective layer 1306 can include an anodized layer. The protective layer 1306 can be formed by anodizing the second material 1302, such as through sulfuric acid anodizing the second material 1302. The protective layer 1306 can have a thickness in a range from about 12 μm to about 15 μm.

In FIG. 13C, the first material 1302 is etched to form pores or openings 1308. The first material 1302 can be etched in an electrolytic solution. The first material 1302 can be etched in a semi-aqueous solution. The first material 1302 can be etched in a solution including iron chloride (e.g., $FeCl_3$). The first material 1302 can be etched in a solution including acetic acid ($CH_3COOH$) and sodium chloride (NaCl). In some examples, the first material 1302 can be etched in a multi-step etch process, such as with a first solution of iron chloride, and a second solution of acetic acid and sodium chloride. In some examples, the first material 1302 can be etched in a solution including iron chloride (e.g., $FeCl_3$), propylene glycol, and gluconate. The first material 1302 can be etched such that the pores 1308 have a pore density of about 8% to about 45% of an area of the first material 1302, pore depths in a range from about 50 μm to about 110 μm, and pore diameters in a range from about 90 μm to about 130 μm. The second material 1304 is protected by the protect layer 1306, such that the second material 1304 is not etched by the etching processes used to etch the first material 1302.

In FIG. 13D, the protective layer 1306 is removed. After the protective layer 1306 is removed, a top surface of the second material 1304 is exposed. In FIG. 13E, the second material 1304 is etched to form pores or openings 1310. The second material 1304 can be etched in a solution including iron chloride (e.g., $FeCl_3$), sulfuric acid ($H_2SO_4$), and tartaric acid ($C_4H_6O_6$). The second material 1304 can be etched such that the pores 1310 have a pore density of about 20% to about 70% of an area of the second material 1304, or from about 30% to about 65% of an area of the second material 1304; pore depths in a range from about 25 μm to about 50 μm, and pore diameters in a range from about 90 μm to about 130 μm. As such, the pores 1310 in the second material 1304 can have a greater pore density than the pores 1308 of the first material 1302. The pores 1308 in the first material 1302 can have a greater pore depths (e.g., a greater average pore depth) than the pores 1310 of the second material 1304. A moldable material, such as the moldable material 714 described above, can flow into the pores 1308, 1310 in order to mechanically engage the pores 1308, 1310, and couple the moldable material to composite components including the composite material 1300.

According to the example illustrated in FIGS. 13A through 13D, the formation of the protective layer on the second material 1304 can allow the first material 1302 to be etched by a more extreme process that would, without the protective layer, rapidly deplete the second material. According to this example, the pores 1308 formed in the first material 1302 are formed, the protective layer 1306 is removed, and the second material 1304 is exposed to a process that does not significantly impact the pores 1308 formed in the first material 1302, while forming pores 1310 in the second material. In this manner, the pores 1308, 1310 can have substantially similar geometries and properties, but in dissimilar materials.

Figure 13F:
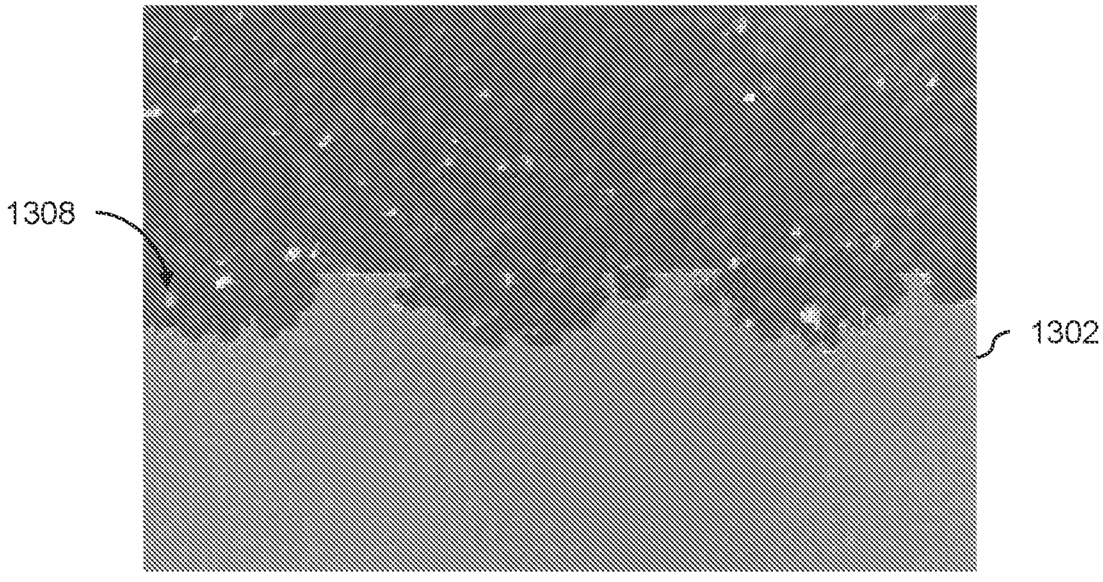
FIGS. 13F, 13G, and 13H illustrate microscopic cross-sectional views of portions of a clad material etched by the method of FIGS. 13A through 13E.
Figure 13G:
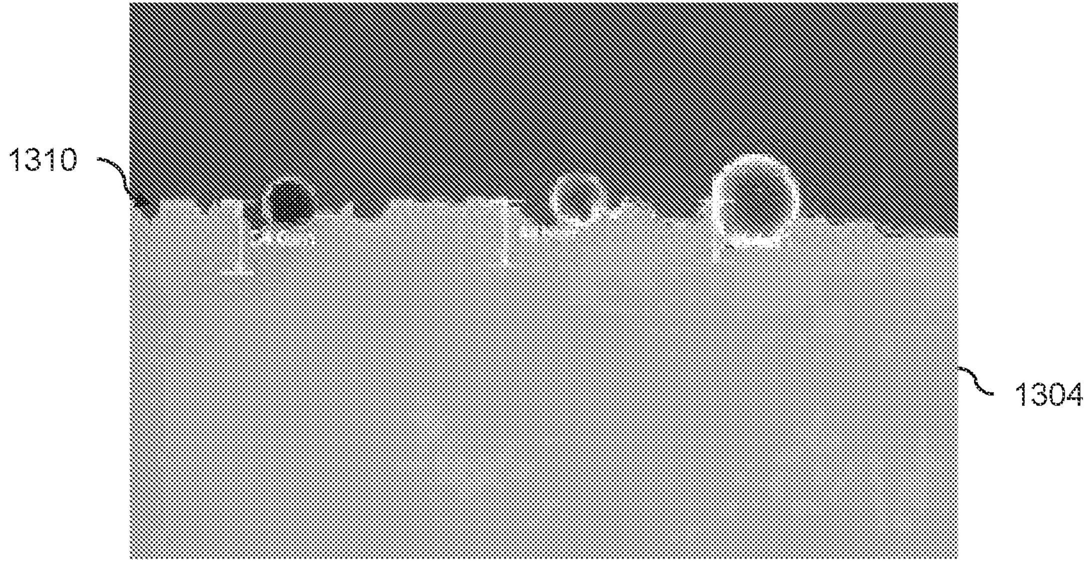

FIGS. 13F and 13G illustrate microscopic cross-sectional views of portions of a clad material etched by the method of FIGS. 13A through 13E. FIG. 13F is a microscopic cross-sectional view of the first material 1302 including pores 1308 subsequent to the first material 1302 being etched by the etch process discussed with respect to FIG. 13C. FIG. 13G is a microscopic cross-sectional view of the second material 1304 including pores 1310 subsequent to the second material 1304 being etched by the etch process discussed with respect to FIG. 13E. The pores 1308 and the pores 1310 can have similar properties, such as a pore density, pore depths, and pore diameters. The pores 1308 formed in the first material can have more uniform properties, such as a more uniform pore density, pore depths, and pore diameters as compared to the pores 1310.

Figure 13H:
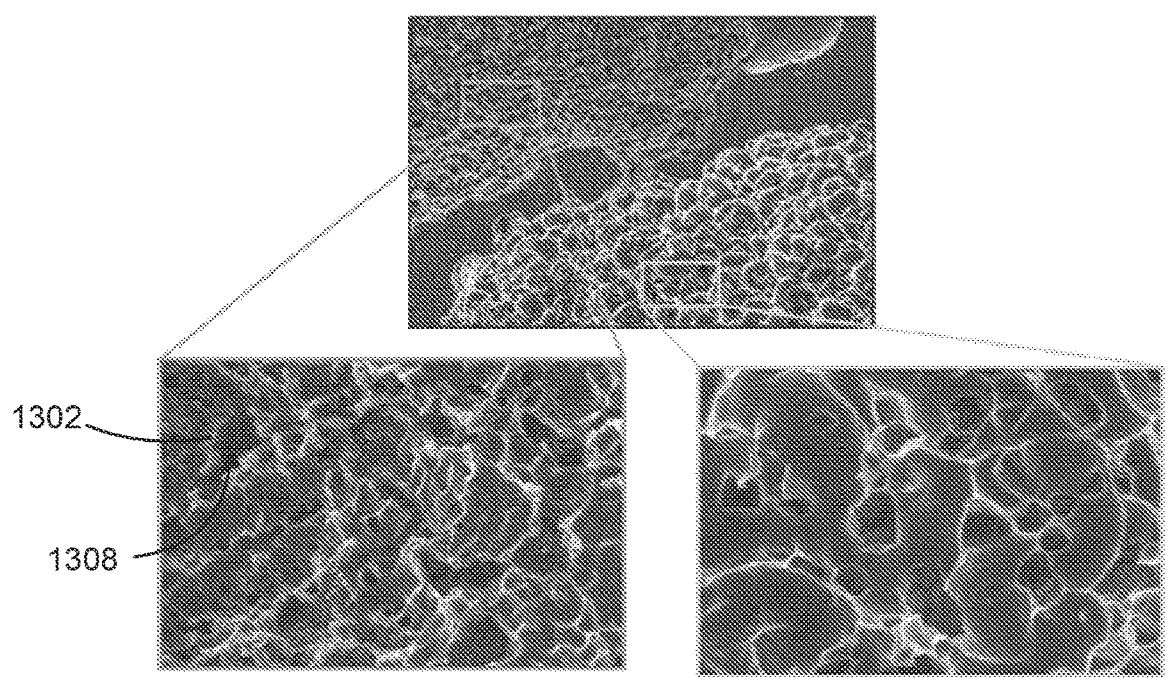
Figure 13I:
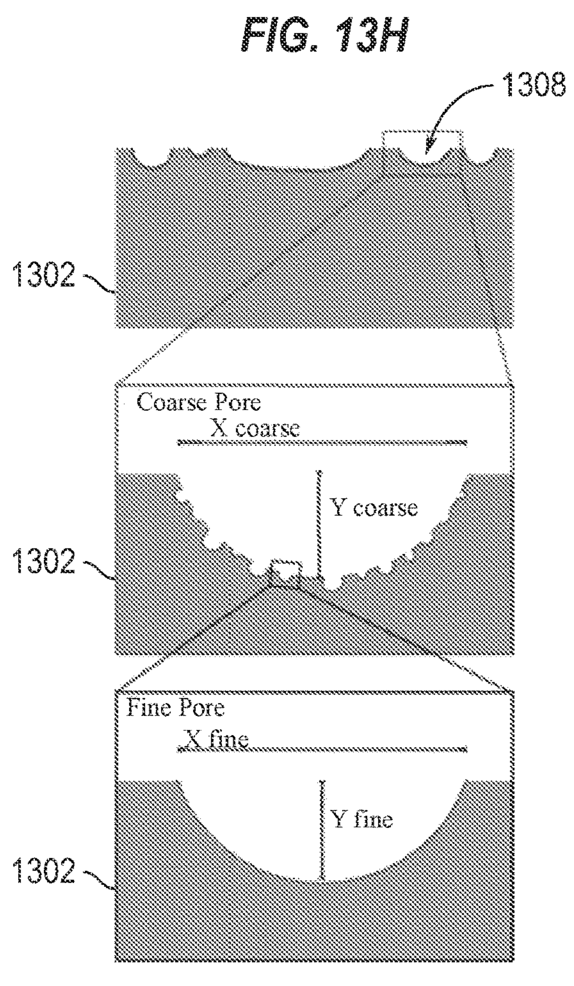
FIG. 13I illustrates a cross-sectional view of an etched clad material.

FIG. 13H illustrates scanning electron microscopic views of portions of a clad material, such as a titanium portion, etched by the method of FIGS. 13A through 13E. FIG. 13I illustrates a cross-sectional view of the etched clad material shown in FIG. 13H. As shown in FIG. 13I, the first material 1302 can be etched to include coarse pores and fine pores. In other words, the etching process can form pores or openings 1308 such that the coarse pore diameters are in a range from about 1 μm to about 1000 μm, from about 5 μm to about 800 μm or from about 20 μm to about 500 μm. The coarse pores can include a pore depth in a range from about 1 μm to about 100 μm, from about 5 μm to about 80 μm, or from about 10 μm to about 60 μm. In the coarse etch, the pores 1308 can further include or define micropores within the surface larger coarse pores. In other words, the larger coarse pores 1308 can include fine pores having pore diameters in a range from about 1 nm to about 3000 nm, from about 25 nm to about 2500 nm, or from about 50 nm to about 2000 nm on the inner surface of the coarse pores. In some examples, the first material 1302 is etched to include a fine etch. In a fine etch, the etching process can form or define pores or openings 1308 such that the pore diameters are in a range from about 25 nm to about 250 nm, or from about 50 nm to about 100 nm. The etched titanium surface can include a combination of both coarse and fine pores, as shown in FIG. 13H.

Figure 14:
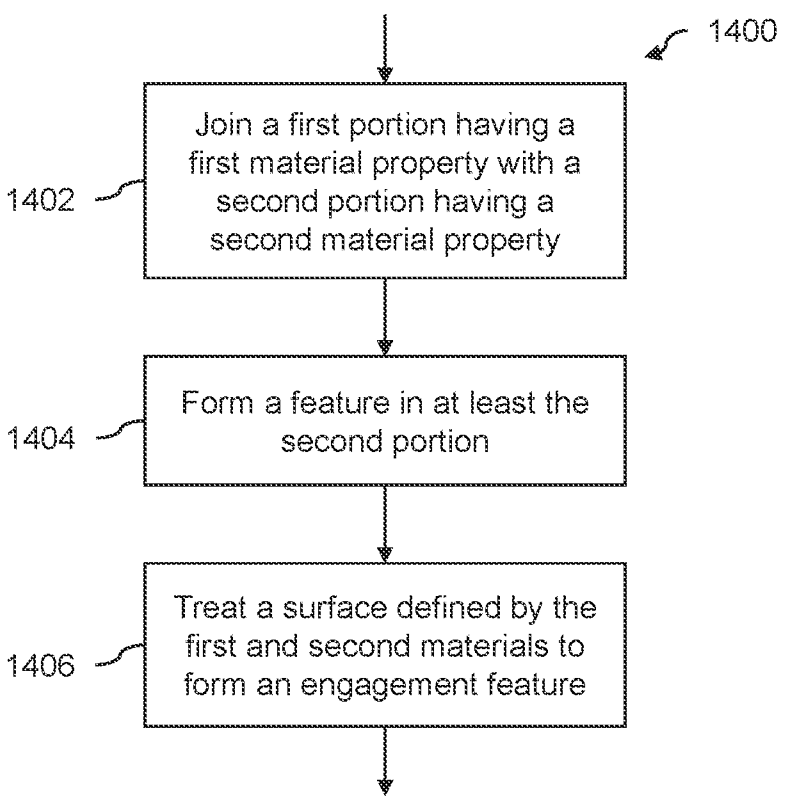
FIG. 14 illustrates a flow diagram of a method of forming a clad component for an electronic device.

FIG. 14 is a flow chart of a method 1400 for forming a composite component for an electronic device having engagement features on a surface, as described herein. The method 1400 for forming the composite component can include joining a first portion, such as an exterior portion including a first material having a first material property or set of material properties, with a second portion, such as an interior portion including a second material having a second material property or set of material properties, at step 1402. The method 1400 can further include forming one or more features in at least the second portion at step 1404, and treating a surface defined by the first portion and the second portion to form an engagement feature thereon at step 1406.

At step 1402, a first portion, such as an exterior portion of a composite component can be joined with a second portion, such as an interior portion, as described herein. The first portion can include a first material, while the second portion can include a second, independently selected material. In some examples, the materials of the first and second portions can include any of the materials described herein with respect to interior and/or exterior portions of a composite component.

In some examples, the first portion can be joined to the second portion to form a composite material through a roller bonding process, as described above with respect to FIG. 9. In some examples, the first portion can be joined to the second portion to form a composite material through a direct metal deposition process, as described above with respect to FIG. 11. In some examples, the first portion can be joined to the second portion to form a composite material through a nanopulse welding process, as described above with respect to FIG. 12. The first and second portions can be joined by a chemical bond, a metallurgical bond, mechanical engagement, and other joining methods.

At step 1404, one or more features are formed in at least the second portion of the composite component. The feature or features can be formed according to any of the processes or methods described herein, such as additive or subtractive manufacturing processes. For example, one or more features can be formed in at least the second portion by machining, etching, depositing, molding, or other processes. In some examples, the one or more features can be formed in both the first portion and the second portion, as described herein. In some examples, forming one or more features in at least the second component at step 1404 can occur substantially simultaneously with the joining step at step 1402.

At step 1406, a surface defined by the first portion and the second portion can be treated to form an engagement feature on or in the surface, as described herein. For example, the processes of FIGS. 13A through 13E can be used to form pores 1308, 1310 in the first and second portions, which can form the engagement feature in the surfaces of the first and second portions. In some examples, an engagement feature can range in size from nano- or micro-scaled features to macro-scale features having dimensions on the order or millimeters. Further, in some examples, the treatment at step 1406 can form more than one engagement feature on the surface. The treatment process can include any number of additive or subtractive processes. In some examples, an engagement feature formation process can form the engagement feature on a part of the surface defined by the interior portion, but may not form an engagement feature on or otherwise substantially damage or degrade the part of the surface defined by the exterior portion. In some examples, the treatment process can additionally form an engagement feature on a part of the surface defined by the exterior portion, but may not form an engagement feature on or otherwise substantially damage or degrade the part of the surface defined by the interior portion. That is, in some examples, the treatment at step 1406 can form an engagement feature on only a part of the surface defined by one of the interior or exterior portion during one stage, and can form an engagement feature on a part of the surface defined by the other of the interior or exterior portion during a second stage.

In some examples, a stage of the treatment at step 1406 can affect or substantially affect only the material of one of the interior or exterior portions. In some examples, however, the part of the surface defined by one of the interior or exterior portions can be masked or otherwise treated (e.g., using the protective layer 1306) so that a stage of the treatment only affects or forms features on the unmasked, or untreated portion (e.g., the first portion 1302). In some examples, the treatment can form an engagement feature or features on a part of the surface defined by both the interior portion and the exterior portion. The treatment at step 1406 can include a subtractive treatment process or processes, such as machining, etching, laser-based processes, cutting, grinding, and similar subtractive processes. In some examples, the treatment at step 1406 can include an additive process, such as a deposition process, a thermal spraying process, a 3D printing process, and other similar additive processes. In some examples, the treatment at step 1406 can include multiple processes to form the engagement feature or features.

In some examples, the method 1400 can further include providing a moldable material, for example moldable material 714 described herein, to the surface including the engagement feature. The moldable material can be provided in a moldable or a flowable form. The method 1400 can further include hardening, curing, cooling, or otherwise solidifying the moldable material to mechanically engage the moldable material with the formed engagement feature. The moldable material can also be mechanically engaged with one or more other components, and can serve to join the components together, for example, as described herein.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. A housing for an electronic device, comprising:
an exterior titanium portion;
an interior metal joined to the exterior titanium portion, the interior metal being a different metal than the exterior titanium portion; and
an intermetallic compound layer having a thickness of less than 1 μm disposed between the interior metal and the exterior titanium portion;
wherein the intermetallic compound layer is free of discrete oxide particles.

2. The housing of claim 1, wherein the intermetallic compound layer has a thickness of less than 200 nm.

3. The housing of claim 1, wherein the interior metal comprises aluminum.

4. The housing of claim 1, wherein the intermetallic compound layer comprises $Al_3Ti$.

5. The housing of claim 1, wherein:
the intermetallic compound layer comprises a continuous layer between the interior metal and the exterior titanium portion; and
the intermetallic compound layer separates the interior metal from the exterior titanium portion.

6. The housing of claim 1, wherein:
the intermetallic compound layer comprises a discontinuous layer between the interior metal and the exterior titanium portion; and
the interior metal contacts the exterior titanium portion.

7. A housing for an electronic device, comprising:

an exterior titanium portion at least partially defining a first engagement feature; and an interior aluminum portion joined to the exterior titanium portion, the interior aluminum portion at least partially defining the first engagement feature, wherein:

a first surface of the exterior titanium portion defining the first engagement feature comprises a first plurality of pores, the first plurality of pores having a first pore density and a first average pore depth; and a second surface of the interior aluminum portion defining the first engagement feature comprises a second plurality of pores, the second plurality of pores having a second pore density and a second average pore depth.

8. The housing of claim 7, wherein:

the first pore density is between approximately 8% and 45%;

the first average pore depth is between 50 μm and 110 μm.

9. The housing of claim 8, wherein:

the second pore density is between approximately 30% and 65%; and the second average pore depth is between 25 μm and 50 μm.

10. The housing of claim 7, further comprising an intermetallic compound disposed between the exterior titanium portion and the interior aluminum portion, the intermetallic compound comprising $Al_3Ti$.

11. The housing of claim 10, wherein:

the intermetallic compound comprises a first layer, and a second layer different from the first layer; and the intermetallic compound has a thickness of less than 500 nm.

12. The housing of claim 10, wherein the intermetallic compound comprises a continuous layer having a thickness of less than 200 nm.

13. The housing of claim 10, wherein the intermetallic compound comprises a discontinuous layer having a thickness of less than 150 nm.

14. The housing of claim 10, wherein the intermetallic compound is free from discrete oxide particles.

15. A housing for a portable electronic device, comprising:

a titanium clad sidewall portion at least partially defining an internal volume and an external surface of the portable electronic device, the titanium clad sidewall portion comprising:

a metal outer portion comprising a first material having a first set of material properties, the metal outer portion at least partially defining a first engagement feature;

an inner portion bonded to the metal outer portion, the inner portion comprising a second material having a second set of material properties independent of the first set of material properties, the inner portion at least partially defining the first engagement feature;

wherein a surface of the metal outer portion defining the first engagement feature has a pore density from approximately 8% to 45%, pore depths from 50 μm to 110 μm, and pore diameters from 50 μm to 110 μm.

16. The housing of claim 15, further comprising a moldable material mechanically engaging the first engagement feature, wherein the moldable material is at least partially disposed in pores in the surface of the metal outer portion.

17. The housing of claim 15, wherein:

the metal outer portion comprises titanium;

the inner portion comprises aluminum;

the titanium clad sidewall portion further comprises an intermetallic compound disposed between the metal outer portion and the inner portion; and the intermetallic compound comprises a continuous layer having a thickness of less than 200 nm.

18. The housing of claim 15, wherein:

the metal outer portion comprises titanium;

the inner portion comprises aluminum;

the titanium clad sidewall portion further comprises an intermetallic compound disposed between the metal outer portion and the inner portion; and the intermetallic compound comprises a discontinuous layer having a thickness of less than 150 nm.

19. The housing of claim 15, wherein:

the metal outer portion comprises titanium;

the first engagement feature defines a coarse pore having a diameter between about 20 μm to about 500 μm and a depth between about 10 μm to about 60 μm; and the first engagement feature further defines a fine pore within the coarse pore having a pore diameter between about 50 nm to about 2000 nm and a depth between about 50 nm to about 100 nm.

* * * * *